(12) United States Patent
Fernandez-Galindo et al.

(10) Patent No.: US 10,935,605 B2
(45) Date of Patent: Mar. 2, 2021

(54) BATTERY ARRAY ACTIVATING ASSEMBLY AND METHOD

(71) Applicant: Ford Global Technologies, LLC, Dearborn, MI (US)

(72) Inventors: Francisco Fernandez-Galindo, Canton, MI (US); Daniel Paul Roberts, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 235 days.

(21) Appl. No.: 15/970,248

(22) Filed: May 3, 2018

(65) Prior Publication Data
US 2019/0339331 A1   Nov. 7, 2019

(51) Int. Cl.
| | |
|---|---|
| *G01R 31/00* | (2006.01) |
| *G01R 31/364* | (2019.01) |
| *H01R 11/28* | (2006.01) |
| *H01R 13/66* | (2006.01) |
| *G01R 31/50* | (2020.01) |
| *G01R 31/52* | (2020.01) |
| *G01R 31/54* | (2020.01) |
| *G01R 35/00* | (2006.01) |

(52) U.S. Cl.
CPC ......... *G01R 31/364* (2019.01); *G01R 31/006* (2013.01); *G01R 31/007* (2013.01); *G01R 31/50* (2020.01); *G01R 31/52* (2020.01); *G01R 31/54* (2020.01); *H01R 11/281* (2013.01); *H01R 13/6683* (2013.01); *G01R 31/005* (2013.01); *G01R 31/008* (2013.01); *G01R 35/00* (2013.01)

(58) Field of Classification Search
CPC ...... G01R 31/006; G01R 31/50; G01R 31/52; G01R 31/007; G01R 31/54; G01R 31/008; G01R 31/005; G01R 35/00
USPC ................................. 324/158, 378, 500, 503
See application file for complete search history.

(56) References Cited

U.S. PATENT DOCUMENTS

| | | | |
|---|---|---|---|
| 5,030,916 A | 7/1991 | Bokitch | |
| 7,381,101 B2 | 6/2008 | Roset et al. | |
| 2008/0143461 A1 | 6/2008 | Hastings et al. | |
| 2009/0267566 A1* | 10/2009 | Yano | B60L 58/12 |
| | | | 320/118 |
| 2010/0055549 A1* | 3/2010 | Corder | H01M 10/425 |
| | | | 429/97 |

(Continued)

FOREIGN PATENT DOCUMENTS

| | | |
|---|---|---|
| CN | 204990922 | 1/2016 |
| EP | 0402286 | 12/1990 |

*Primary Examiner* — Raul J Rios Russo
(74) *Attorney, Agent, or Firm* — David Kelley, Esq.; Carlson, Gaskey & Olds, P.C.

(57) ABSTRACT

An exemplary array activating assembly includes, among other things a disconnect key moveable back and forth between an engaged and a disengaged position relative to a battery array. The disconnect key completes an electrical conductive path of the battery array when in the engaged position. The electrical conductive path is open when the disconnect key is in the disengaged position. An exemplary array activating method includes moving a disconnect key relative to a battery array from a disengaged to an engaged position. The disconnect key completes an electrical conductive path of the battery array when in the engaged position. The disconnect key does not complete the electrical conductive path when in the disengaged position.

18 Claims, 3 Drawing Sheets

(56) References Cited

U.S. PATENT DOCUMENTS

| | | | | |
|---|---|---|---|---|
| 2010/0121511 A1* | 5/2010 | Onnerud | ............... | B60L 58/12 |
| | | | | 701/22 |
| 2012/0094150 A1* | 4/2012 | Troutman | ............ | H01M 2/202 |
| | | | | 429/50 |
| 2014/0097797 A1* | 4/2014 | Hendrix | ........... | H01M 10/6571 |
| | | | | 320/118 |
| 2015/0280182 A1* | 10/2015 | Gibeau | ................ | H01M 2/34 |
| | | | | 429/97 |
| 2015/0291130 A1* | 10/2015 | Maguire | ............... | B60R 25/40 |
| | | | | 70/237 |
| 2018/0132850 A1* | 5/2018 | Leimbach | ............. | A61B 90/98 |
| 2019/0339331 A1* | 11/2019 | Fernandez-Galindo | ................... | |
| | | | | B60L 50/66 |

* cited by examiner

BATTERY ARRAY ACTIVATING ASSEMBLY AND METHOD

TECHNICAL FIELD

This disclosure relates generally to activing a battery array. More particularly, the disclosure relates to activating the battery array at some times, and deactivating the battery array at other times.

BACKGROUND

Electrified vehicles differ from conventional motor vehicles because electrified vehicles are selectively driven using one or more electric machines powered by a traction battery pack. The electric machines can drive the electrified vehicles instead of, or in addition to, an internal combustion engine. Example electrified vehicles include hybrid electrified vehicles (HEVs), plug-in hybrid electrified vehicles (PHEVs), fuel cell vehicles (FCVs), and battery electrified vehicles (BEVs).

The traction battery pack can include at least one battery array that include a plurality of battery cells. The battery array can include a positive terminal, a negative terminal, and circuitry extending therebetween. If the positive and negative terminals are both contacted, the battery array can undesirably short circuit. To meet requirements for how the battery array responds to short circuiting, some battery arrays include circuitry that partially or completely ruptures in response to a short circuit. This can address the short circuit, but render the battery array unusable.

SUMMARY

An exemplary non-limiting embodiment of an array activating assembly according to an exemplary aspect of the present disclosure includes, among other things a disconnect key moveable back and forth between an engaged and a disengaged position relative to a battery array. The disconnect key completes an electrical conductive path of the battery array when in the engaged position. The electrical conductive path is open when the disconnect key is in the disengaged position.

In a further non-limiting embodiment of the foregoing array activating assembly, the electrical conductive path extends continuously from a positive terminal to a negative terminal of the battery array when the disconnect key is in the engaged position.

In a further non-limiting embodiment of any of the foregoing array activating assemblies, the disconnect key includes a handle and a terminal tab. The terminal tab completes the electrical conductive path when the disconnect key is in the engaged position.

In a further non-limiting embodiment of any of the foregoing array activating assemblies, the handle is polymer-based, and the terminal tab comprises a metal or metal alloy.

A further non-limiting embodiment of any of the foregoing array activating assemblies includes the battery array. The battery array includes a plurality of battery cells held between a first array wall and a second array wall. The first array wall includes a receptacle that receives the disconnect key when the disconnect key is in the engaged position.

In a further non-limiting embodiment of any of the foregoing array activating assemblies, the plurality of battery cells are disposed along an axis, and the first and second array walls are sidewalls disposed along laterally facing sides of the plurality of battery cells.

In a further non-limiting embodiment of any of the foregoing array activating assemblies, the first array wall includes a first side facing the plurality of battery cells. The first array wall also includes an opposite second side. The disconnect key extends from the first to the second side when the disconnect key is in the engaged position.

A further non-limiting embodiment of any of the foregoing array activating assemblies includes the battery array. The battery array includes a plurality of battery cells held between a first array wall and a second array wall. The first array wall includes a first side facing the plurality of battery cells and an opposite second side. The disconnect key includes a linkage extending from the first side past the second side to a position outside the battery array when the disconnect key is in the engaged and disengaged position.

A further non-limiting embodiment of any of the foregoing array activating assemblies includes at least one mechanical fastener configured to move to a secured position, thereby moving the linkage and transitioning the disconnect key from the disengaged to the engaged position.

A further non-limiting embodiment of any of the foregoing array activating assemblies includes a battery pack enclosure. The at least one mechanical fastener is configured to secure the battery array relative to the traction battery pack enclosure when the at least one mechanical fastener is in the secured position.

An array activating method according to another exemplary non-limiting embodiment of the present disclosure includes moving a disconnect key relative to a battery array from a disengaged to an engaged position. The disconnect key completes an electrical conductive path of the battery array when in the engaged position. The disconnect key does not complete the electrical conductive path when in the disengaged position.

In a further non-limiting embodiment of the foregoing method, the electrical conductive path extends continuously from a positive terminal to a negative terminal of the battery array when the disconnect key is in the engaged position.

A further non-limiting embodiment of any of the foregoing methods includes inserting the disconnect key into a receptacle of the battery array when moving the disconnect key from the disengaged to the engaged position.

In a further non-limiting embodiment of any of the foregoing methods, the receptacle is within a first array wall of the battery array. The first array wall and a second array wall are disposed on opposite sides of a plurality of battery cells of the battery array.

In a further non-limiting embodiment of the foregoing method, the plurality of battery cells are disposed along an axis, and the first and second array walls are disposed along opposing laterally facing sides of the plurality of battery cells.

A further non-limiting embodiment of the foregoing method includes inserting the disconnect key into the receptacle from outside the battery array.

A further non-limiting embodiment of the foregoing method includes transitioning the disconnect key from the disengaged to the engaged position when securing the battery array within a battery pack enclosure.

In a further non-limiting embodiment of the foregoing method, the securing includes using a mechanical fastener to secure the battery array within the traction battery pack enclosure.

In a further non-limiting embodiment of the foregoing method, the securing moves a linkage of the disconnect key to reposition the disconnect key and transition the disconnect key from the disengaged to the engaged position.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure relates to a traction battery pack of an electrified vehicle. In particular, the disclosure relates to a disconnect key utilized in connection with battery arrays of the traction battery pack.

The disconnect key in a disengaged position relative to a battery array can deactivate the battery array by keeping open an electrical conductive path of the battery array. This can prevent the battery array from short circuiting. When activating the battery array is desired, the disconnect key can be moved to an engaged position to complete the electrical conductive path within the battery array.

Figure 1:
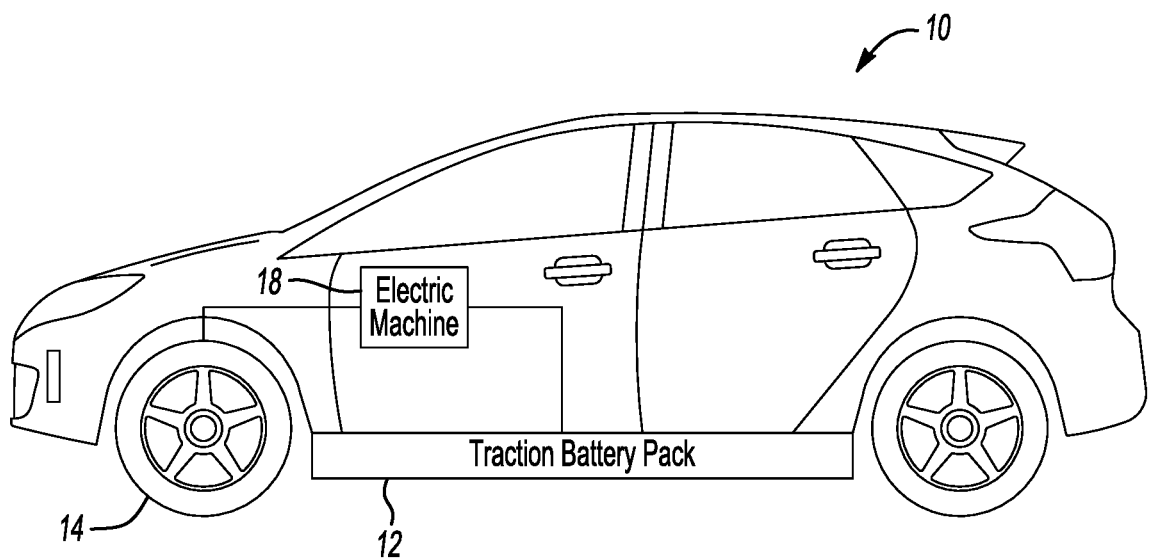
FIG. 1 illustrates a side and partially schematic view of an electrified vehicle.

Referring to FIG. 1, an exemplary electrified vehicle 10 includes a traction battery pack 12. A power-split powertrain of the electrified vehicle 10 employs a first drive system and a second drive system. The first and second drive systems generate torque to drive one or more sets of vehicle wheels 14. The first drive system can include, in combination, an internal combustion engine and a generator. The second drive system can include at least a motor, the generator, and the traction battery pack 12.

The exemplary electrified vehicle 10 is described above as a hybrid electrified vehicle (HEV). The electrified vehicle 10, in other examples, could be another type of electrified vehicle such as an all-electric vehicle Like the HEV, the all-electric vehicle can include a traction battery pack that powers an electric machine. Electric power from the traction battery pack is converted into torque to drive the wheels of the electrified vehicle. The teachings of this disclosure could apply to traction batteries used in hybrid vehicles, in all-electric vehicles, or in other types of electrified vehicles.

Figure 2:
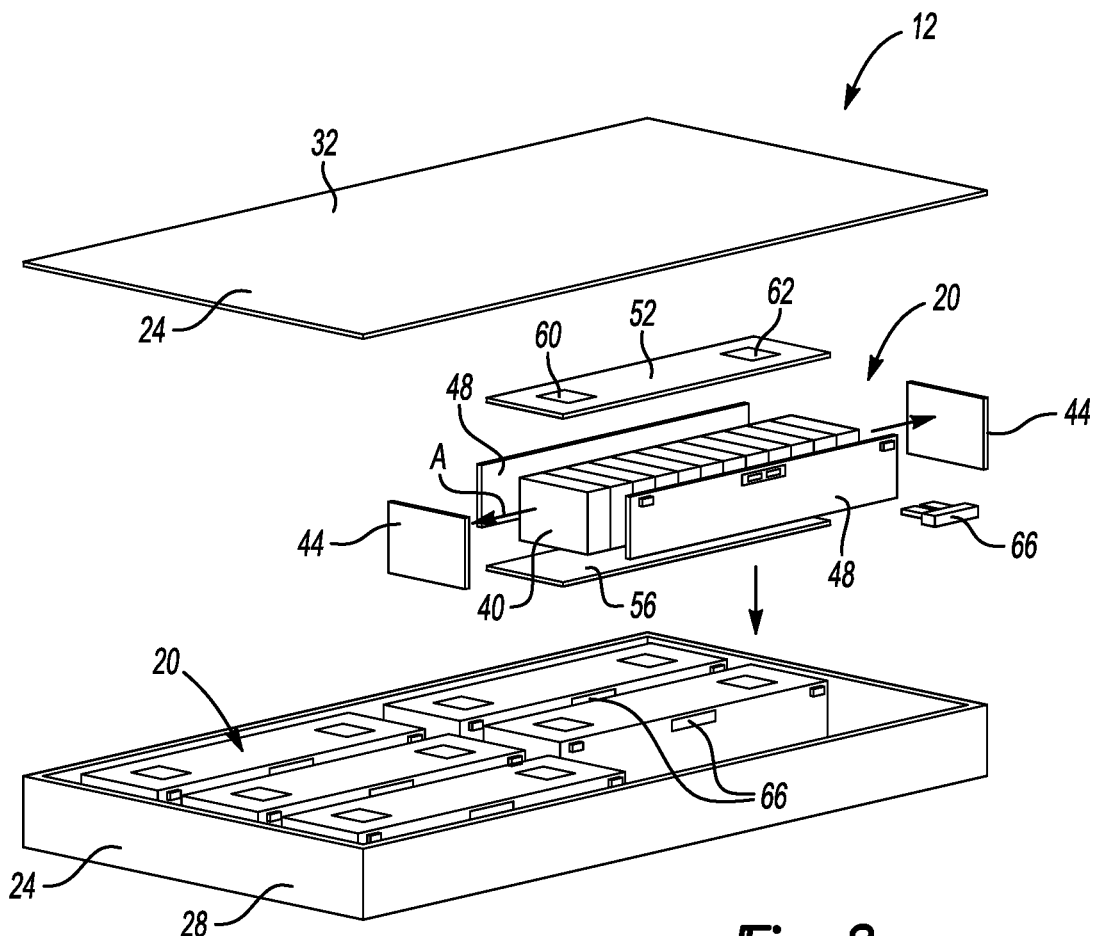
FIG. 2 illustrates an expanded view of a traction battery pack from the electrified vehicle of FIG. 1.

With reference now to FIG. 2, the traction battery pack 12 includes a plurality of battery arrays 20 housed within an enclosure 24. Six battery arrays 20 are housed within the enclosure 24 in this example. In other examples, other numbers of battery arrays 20 could be used. The traction battery pack 12 and arrays 12 can be considered high-voltage.

The enclosure 24 includes a tray 28 and a lid 32 in the exemplary embodiment. Individual battery arrays 20 can be shipped to an assembly location and placed within the enclosure 24. The lid 32 is then secured relative to the tray 28 to enclose the battery arrays 20. The battery pack 12 can then be mounted to the electrified vehicle 10.

Each of the battery arrays 20 includes a plurality of individual battery cells 40 disposed along an axis A. Endplates 44 at opposite ends of the battery cells can hold the battery cells 40 axially. The endplates 44 are a type of array wall.

The battery array 20 includes additional array walls such as sidewalls 48, a top wall 52, and a bottom wall 56. The sidewalls 48 can be disposed against opposite laterally facing sides of the plurality of battery cells 40.

The top wall 52 can be positioned along an upwardly facing side of the battery cells 40. The example top wall 52 includes a positive terminal 60 and a negative terminal 62. Electrical connectors can be electrically coupled to the terminals 60 and 62 within the traction battery pack 12 so that power can move to and from the battery cells 40. Each of the example battery arrays 20 includes a single positive terminal 60 and a single negative terminal 62, although other numbers of the terminals, 60, 62 could be used.

The bottom wall 56 is a thermal exchange plate in the exemplary embodiment. The thermal exchange plate 56 can be utilized to control thermal energy of the battery cells 40 and the remaining portions of the battery array 20. For example, fluid can move through areas of the bottom 56 to transfer thermal energy between the bottom wall 56 and the battery cells 40.

Figure 3:
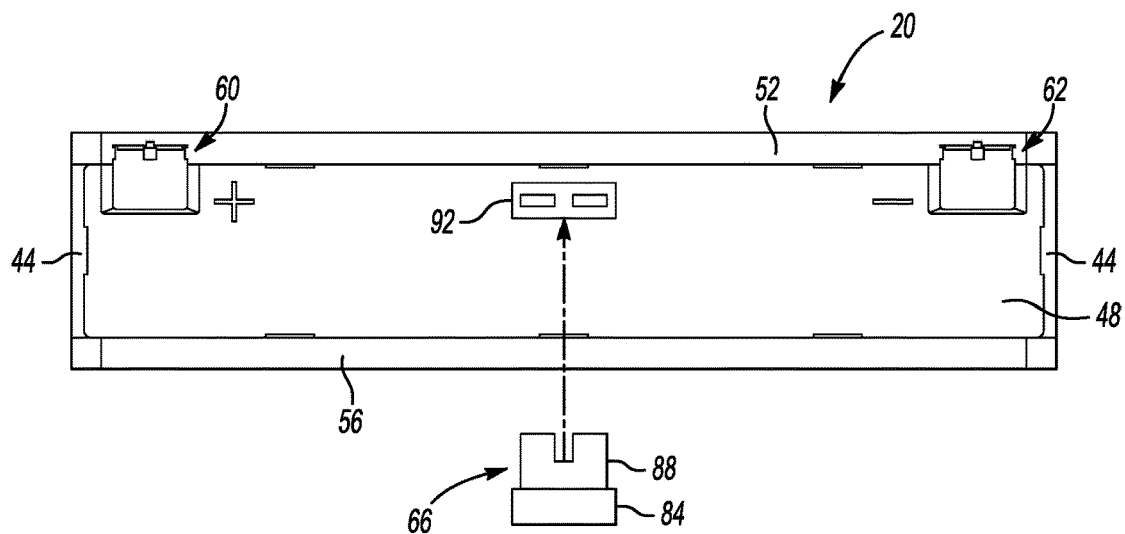
FIG. 3 illustrates a side view of a battery array from the traction battery pack and a disconnect key in a disengaged position relative to the battery array of FIG. 2.
Figure 4A:
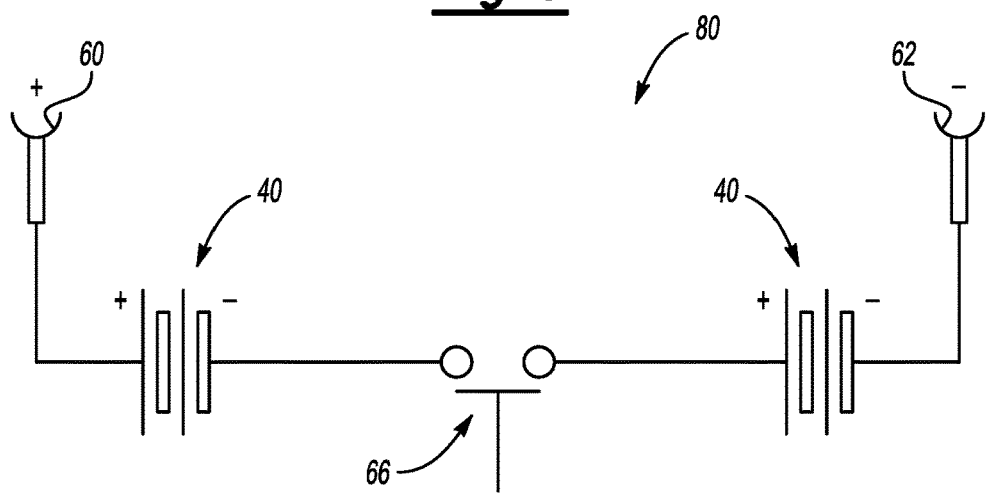
FIG. 4A illustrates an electrical conductive path of the battery array of FIG. 3 when the disconnect key is in the disengaged position.
Figure 4B:
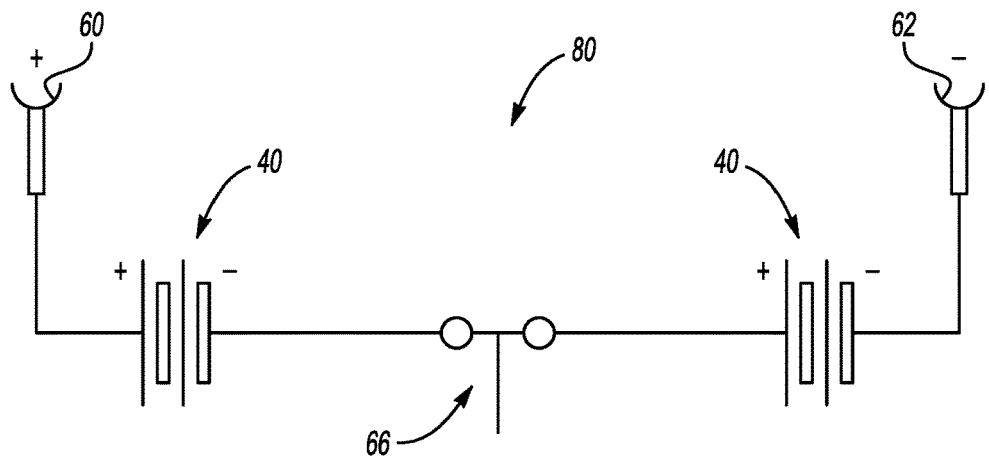
FIG. 4B illustrates the electrical conductive path of FIG. 4A when the disconnect key is in an engaged position.

With reference now to FIGS. 3-4B and continuing reference to FIG. 2, a disconnect key 66, or shunt, can be utilized in connection with the battery array 20. The disconnect key 66 can move between from a disengaged position to an engaged position with the battery array 20.

FIGS. 3 and 4A shows the disconnect key 66 in a disengaged position. When the disconnect key 66 is in the disengaged position, an electrical conductive path 80 extending from the positive terminal 60 to the negative terminal 62 within the battery array 20 is open. That is, when the disconnect key 66 is in the disengaged position, the battery array 20 is mechanically and electrically disabled. The battery array 20 will pass a short circuit test when the disconnect key 66 in the disengaged position since there is substantially no voltage across the positive terminal 60 and negative terminal 62 and no current flow.

FIG. 4B shows the electrical conductive path 80 when the disconnect key 66 is in the engaged position. The disconnect key 66 in the engaged position completes the electrical conductive path 80 within the battery array 20. The disconnect key 66 in the engaged position can bridge a gap within the battery array 20 between a positive busbar and a negative busbar, for example.

The electrical conductive path 80 extends within the battery array 20 from the positive terminal 60 to the negative terminal 62. If the electrical conductive path 80 is complete, there is voltage across the positive terminal 60 and the negative terminal 62. Thus, when the electrical conductive path is complete, the battery array 20 could short circuit if, for example, an electrically conductive material contacted both the positive terminal 60 and the negative terminal 62.

An electrically conductive component could contact the positive terminal 60 and the negative terminal 62 when the battery array 20 is shipped, for example. When the battery array 20 of the exemplary embodiment is shipped, the disconnect key 66 can be placed in the disengaged position to open the electrical conductive path 80. When the electrical conductive path 80 is open, there is substantially no voltage across the positive terminal 60 and the negative terminal 62. This can prevent the battery array 20 from short circuiting if, for example, the conductive component were to contact both the positive terminal 60 and the negative terminal 62.

In an exemplary non-limiting embodiment, the disconnect key 66 includes a handle 84 and a terminal tab 88. The handle 84 can be a polymer-based material. The terminal tab 88 can be a conductive material such as metal or metal alloy.

A user can insert the disconnect key 66 into a receptacle 92 within one of the array walls, here one of the sidewalls 48, to move the disconnect keys 66 to the engaged position. When in the engaged position, the terminal tab 88 completes the electrical conductive path 80 as shown in FIG. 4B. The user interacts with the handle 84 when inserting the disconnect key 66, and the receptacle 92 can be finger proof to protect the user and others.

When in the engaged position, the disconnect key 66 extends from a side of the sidewall 48 facing away from the battery array of battery cells 40 through the sidewall 48 and to an opposite, second side of the sidewall 48 that interfaces with the battery cells 40.

The user may be a technician that is assembling the traction battery pack 12. The user may receive the battery arrays 20 with the disconnect keys 66 in a disengaged position. That is, the battery arrays 20 may be shipped with the disconnect keys 66 in the disengaged position to prevent the battery arrays 20 from short circuiting during shipping. As the technician assembles the battery arrays 20 within the enclosure 24, the technician inserts the respective disconnect keys 66 into the receptacles 92 to complete the electrically conductive path 80 of the various battery arrays 20.

If servicing the battery arrays 20 is ever required, the disconnect keys 66 can be moved back to the disengaged position to electrically disable the battery arrays 20 during service.

Although shown is interfacing with the electrically conductive path 80 between to groupings of battery cells 40 near a middle of the string of battery cells 40, the disconnect key 66 could be located elsewhere when in the engaged position. For example, the disconnect key 66 could complete the electrically conductive path 80 from a position near the positive terminal 60, or a position near the negative terminal 62.

Figure 5A:
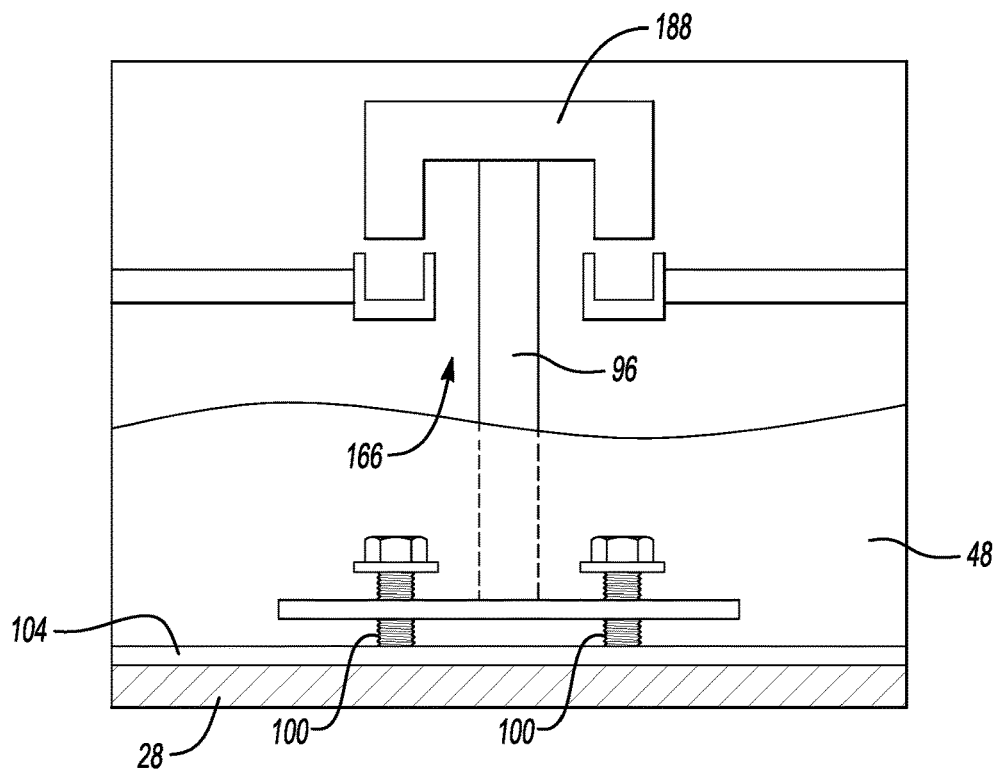
FIG. 5A illustrates a portion of a battery array having a disconnect key according to another exemplary embodiment of the present disclosure when the disconnect key is in a disengaged position.
Figure 5B:
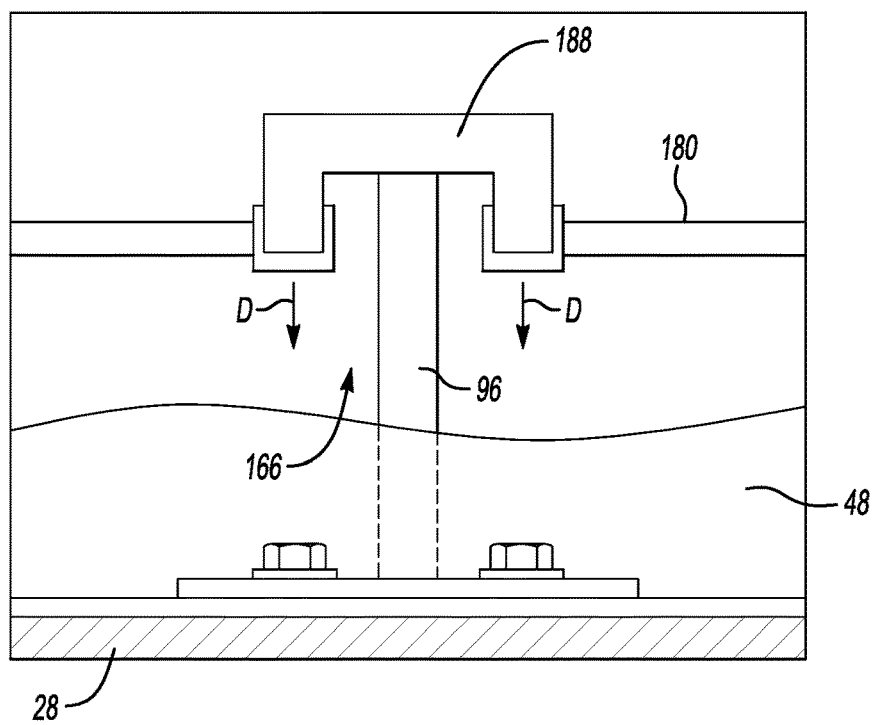
FIG. 5B illustrates the disconnect key of FIG. 5A in an engaged position.

With reference now to FIGS. 5A and 5B, another example disconnect key 166 can include a terminal tab 188 within a battery array 20, and a linkage 96 extending from the terminal tab 88 outside the battery array 20 to a mounting location. At the mounting location, mechanical fasteners 100 can be anchored to a portion of the enclosure 24, here a floor of the tray 28. The mechanical fasteners 100 can be torqued down to the tray 28 to clamp down a laterally extending flange 104 of the sidewall 48. As the mechanical fasteners 100 are torqued down, the mechanical fasteners 100 draw a portion of the linkage 96 downward toward the floor of the tray 28. This moves the linkage 96 downward toward the floor of the tray 28, which draws the terminal tab 188 downward in a direction D into the engaged position of FIG. 5B. In the engaged position of FIG. 5B, the terminal tab 188 completes the electrical conductive path 180 within the associated battery array. The terminal tab 188 could bridge a gap between a positive busbar and a negative busbar within the battery array, for example.

With the disconnect key 166 of this embodiment, there is substantially no need for the technician to incorporate a separate assembly step for manually moving the disconnect key 166 from the disengaged position to the engaged position. Instead, the movement from the disengaged to the engaged position can occur in connection with the technician securing the battery array 20 to the enclosure.

With the embodiments of the disconnect keys 66 and 166, the battery arrays 20 are substantially unable to short circuit when the disconnect keys 66 and 166 are in the disengaged position.

Features of the disclosed examples can include short circuit regulation compliance with high voltage battery arrays under substantially all conditions. The battery arrays can remain electrically disabled until a defined point in the assembly process. The enabling of the battery arrays can be automatic or manually actuated. The battery arrays can be disabled again if servicing is required.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. An array activating assembly, comprising:
a disconnect key moveable back and forth between an engaged and a disengaged position relative to a battery array, the disconnect key completing an electrical conductive path of the battery array when in the engaged position, the electrical conductive path open when the disconnect key is in the disengaged position, wherein the electrical conductive path extends continuously within the battery array from a positive terminal to a negative terminal of the battery array when the disconnect key is in the engaged position, wherein the electrical conductive path between the positive terminal and the negative terminal is open when the disconnect key is in the disengaged position.

2. The array activating assembly of claim 1, further comprising the battery array, the battery array including a plurality of battery cells held between a first array wall and a second array wall, wherein the first array wall includes a receptacle that receives the disconnect key when the disconnect key is in the engaged position.

3. The array activating assembly of claim 2, wherein the plurality of battery cells are disposed along an axis, and the first and second array walls are sidewalls disposed along laterally facing sides of the plurality of battery cells.

4. The array activating assembly of claim 2, wherein the first array wall includes a first side facing the plurality of battery cells and an opposite second side, the disconnect key extending from the first to the second side when the disconnect key is in the engaged position.

5. The array activating assembly of claim 1, further comprising the battery array, the battery array including a plurality of battery cells held between a first array wall and a second array wall, the first array wall including a first side facing the plurality of battery cells and an opposite second side, the disconnect key including a linkage extending from the first side past the second side to a position outside the battery array when the disconnect key is in the engaged and disengaged position.

6. The array activating assembly of claim 5, further comprising at least one mechanical fastener, the at least one mechanical fastener configured to move to a secured position to move the linkage and transition the disconnect key from the disengaged to the engaged position.

7. The array activating assembly of claim 6, further comprising a battery pack enclosure, the at least one mechanical fastener configured to secure the battery array relative to the battery pack enclosure when the at least one mechanical fastener is in the secured position.

8. The array activating assembly of claim 1, further comprising the battery array and a battery pack enclosure, the disconnect key and the battery array configured to be enclosed within the battery pack enclosure, the battery pack enclosure configured to enclosure the disconnect key and the battery array.

9. An array activating assembly, comprising:
a disconnect key moveable back and forth between an engaged and a disengaged position relative to a battery array, the disconnect key completing an electrical conductive path of the battery array when in the engaged position, the electrical conductive path open when the disconnect key is in the disengaged position,
wherein the disconnect key includes a handle and a terminal tab, the terminal tab completing the electrical conductive path within the battery array when the disconnect key is in the engaged position, wherein the electrical conductive path is between a positive terminal and a negative terminal of the battery array, wherein the electrical conductive path is open when the disconnect key is in the disengaged position.

10. The array activating assembly of claim 9, wherein the handle is polymer-based, and the terminal tab comprises a metal or metal alloy.

11. An array activating method, comprising:
moving a disconnect key relative to a battery array from a disengaged to an engaged position, the disconnect key completing an electrical conductive path of the battery array when in the engaged position, the disconnect key not completing the electrical conductive path when in the disengaged position, wherein the electrical conductive path extends continuously within the battery from a positive terminal to a negative terminal of the battery array when the disconnect key is in the engaged position, wherein the electrical conductive path between the positive terminal and the negative terminal is open when the disconnect key is in the disengaged position.

12. The array activating method of claim 11, further comprising inserting the disconnect key into a receptacle of the battery array when moving the disconnect key from the disengaged to the engaged position, wherein the electrical conductive path is between a positive terminal and a negative terminal of the battery array, wherein the electrical conductive path is open when the disconnect key is in the disengaged position and closed when the disconnect key is in the engaged position.

13. The array activating method of claim 12, wherein the receptacle is within a first array wall of the battery array, the first array wall and a second array wall disposed on opposite sides of a plurality of battery cells of the battery array.

14. The array activating method of claim 13, wherein the plurality of battery cells are disposed along an axis, and the first and second array walls are disposed along opposing laterally facing sides of the plurality of battery cells.

15. The array activating method of claim 13, further comprising inserting the disconnect key into the receptacle from outside the battery array, and enclosing the battery array and the disconnect key within an enclosure.

16. The array activating method of claim 11, further comprising transitioning the disconnect key from the disengaged to the engaged position when securing the battery array within a battery pack enclosure.

17. The array activating method of claim 16, wherein the securing comprises using a mechanical fastener to secure the battery array within a traction battery pack enclosure.

18. The array activating method of claim 16, wherein the securing moves a linkage of the disconnect key to reposition the disconnect key and transition the disconnect key from the disengaged to the engaged position.

* * * * *